US008470155B2

(12) United States Patent
Saito et al.

(10) Patent No.: US 8,470,155 B2
(45) Date of Patent: Jun. 25, 2013

(54) COPPER/NIOBIUM COMPOSITE PIPING MATERIAL PRODUCED BY COPPER ELECTROFORMING, PROCESS FOR PRODUCING THE SAME AND SUPERCONDUCTING ACCELERATION CAVITY PRODUCED FROM THE COMPOSITE PIPING MATERIAL

(75) Inventors: Kenji Saito, Ibaraki (JP); Tokumi Ikeda, Osaka (JP); Tamao Higuchi, Aichi (JP)

(73) Assignees: High Energy Accelerator Research Organization, Ibaraki (JP); Nomura Plating Co., Ltd., Osaka (JP)

( * ) Notice: Subject to any disclaimer, the term of this patent is extended or adjusted under 35 U.S.C. 154(b) by 999 days.

(21) Appl. No.: 11/921,154

(22) PCT Filed: May 29, 2006

(86) PCT No.: PCT/JP2006/310662
§ 371 (c)(1),
(2), (4) Date: Jul. 31, 2009

(87) PCT Pub. No.: WO2006/129602
PCT Pub. Date: Dec. 7, 2006

(65) Prior Publication Data

US 2010/0066273 A1 Mar. 18, 2010

(30) Foreign Application Priority Data

May 30, 2005 (JP) ................................ 2005-157313

(51) Int. Cl.
*C25D 1/02* (2006.01)
*C25D 5/12* (2006.01)
*C25D 5/10* (2006.01)
*H01L 39/24* (2006.01)

(52) U.S. Cl.
USPC .............. 205/78; 205/181; 205/182; 505/472

(58) Field of Classification Search
USPC ............................ 205/78, 181, 182; 505/472
See application file for complete search history.

(56) References Cited

U.S. PATENT DOCUMENTS 3,703,447 A 11/1972 Lugscheider
4,632,734 A 12/1986 Mix (Continued)

FOREIGN PATENT DOCUMENTS

DE 19 16 292 12/1970
DE 34 10 243 7/1985

(Continued)

OTHER PUBLICATIONS

Supplementary European Search Report dated Dec. 8, 2011 in European Application No. EP 06 74 6940.

(Continued)

*Primary Examiner* — Kishor Mayekar
(74) *Attorney, Agent, or Firm* — Wenderoth, Lind & Ponack, L.L.P.

(57) ABSTRACT

In order to produce industrially advantageously an electroformed copper/niobium composite piping material wherein an electroformed copper layer and a niobium thin piping material are strongly bonded to each other, the electroformed copper/niobium composite piping material can be produced by coating any one or each of the outer peripheral surface and the inner peripheral surface of a niobium thin piping material with a nickel thin film, coating the surface of the nickel thin film with copper by electroforming, and subsequently annealing the resultant.

11 Claims, 4 Drawing Sheets

U.S. PATENT DOCUMENTS

| | | | | |
|---|---|---|---|---|
| 4,716,423 | A * | 12/1987 | Chan et al. | 347/65 |
| 4,765,055 | A * | 8/1988 | Ozaki et al. | 29/599 |
| 7,101,644 | B2 * | 9/2006 | Toshine et al. | 430/1 |

FOREIGN PATENT DOCUMENTS

| | | |
|---|---|---|
| JP | 50-28902 | 9/1975 |
| JP | 54-033232 | 3/1979 |
| JP | 60-211097 | 10/1985 |
| JP | 60-261202 | 12/1985 |
| JP | 1-231300 | 9/1989 |
| JP | 3-274805 | 12/1991 |
| JP | 2000-306697 | 11/2000 |
| JP | 3545502 | 4/2002 |
| JP | 2002-141196 | 5/2002 |
| JP | 2002-367799 | 12/2002 |
| WO | 02/100133 | 12/2002 |

OTHER PUBLICATIONS

International Search Report issued Sep. 5, 2006 in the International (PCT) Application of which the present application is the U.S. National Stage.

"Development of a Seamless Superconducting High-Frequency Acceleration Cavity Using a Niobium/Copper Clad Material", pp. 12-15, Jul. 2002 (Report of Grants-in-Aid for Scientific Research from Ministry of Education, Culture, Sports, Science and Technology of Japan) and its English translation of the pertinent parts.

* cited by examiner

COPPER/NIOBIUM COMPOSITE PIPING MATERIAL PRODUCED BY COPPER ELECTROFORMING, PROCESS FOR PRODUCING THE SAME AND SUPERCONDUCTING ACCELERATION CAVITY PRODUCED FROM THE COMPOSITE PIPING MATERIAL

This application is a U.S. national stage of International Application No. PCT/JP2006/310662 filed May 29, 2006.

TECHNICAL FIELD

This invention relates to a novel composite piping material which comprises electroformed copper and niobium integrated and bonded strongly with each other, and which can be a starting material for producing a superconducting acceleration cavity that does not have basically any continuous seams by welding along the circumferential direction thereof; a process for producing the same; a superconducting acceleration cavity formed from the composite piping material; and a process for producing the same.

BACKGROUND ART

Conventionally, a process that has been most ordinarily adopted as a process for producing a superconducting acceleration cavity for accelerating charged particles such as electrons, positrons or protons at high frequencies is a process of selecting deep drawing, cutting or some other working appropriately to form plate-form niobium into main parts which constitute a cavity, and then bonding and integrating these with each other by electron beam welding, as illustrated in FIG. 1. This production process requires many working steps; thus, there exists a problem that costs for producing an acceleration cavity are inevitably increased up. Furthermore, there exists a basic problem concerned with accelerating performances since electron beam welding is frequently used. For example, when welding defects are present, in particular, such defects are present in the equator portion of a cavity, heat is often generated in welded sites. Thus, it is known that the heat hinders a high accelerating electric field. However, a process which should be alternative to this process and is for producing stable and excellent acceleration cavities has not been found out; thus, the process is most frequently used at present also. FIG. 2 illustrates an example of a single-cell type superconducting acceleration cavity produced by the above-mentioned process, which is frequently used at present also, and names of portions or sites.

As described in many patent documents, many production processes have been so far investigated and suggested in order to provide an economical superconducting acceleration cavity excellent in accelerating performance. For example, a process described in JP-A-60-261202 is a process wherein attention is paid to a problem that in previously existing techniques, an abnormally thick and expensive niobium material is used in light of a fundamental function of acceleration in an acceleration cavity. In other words, in order to make niobium thin, the process is a process of: using, as a core member, a pipe made of aluminum or an alloy thereof; forming a niobium thin film on the outer peripheral surface of the pipe and a copper thin film on the above-mentioned niobium thin film by sputtering; coating the above-mentioned copper thin film with copper thickly by electroplating; enlarging the pipe by bulge forming to swell the central portion thereof, thereby making the portion into a spherical form; and melting and removing the aluminum or the alloy thereof as the core member, thereby producing a superconducting acceleration cavity. This process has advantages that the niobium material can be saved and any bonding site based on electron beam welding can be eliminated. However, in this process, no considerations are made for pollution of the niobium surface generated at the time of removing the aluminum or the alloy thereof with an acid or alkali, the purity of the formed niobium film, and stress to which the niobium thin film is subjected by the pipe-enlarging working. In other words, the niobium film of 5 to 6 μm thickness, which is originally coated, cannot resist the pipe-enlargement, and further considerations are not entirely made for "creases" or "irregularities" of the niobium surface generated by the pipe-enlargement or the dissolution of niobium and the reduction in the niobium thickness by chemical polishing or electropolishing which is frequently carried out to remove the pollution of the niobium surface after an acceleration cavity is formed. Thus, the process is a process which cannot be practically used at all. Additionally, there are problems about costs such that an expensive large-sized vacuum film-forming apparatus for forming a niobium thin film and a copper thin film is indispensable.

In contrast with the fact that it is essential in the process of JP-A-60-261202 that the pipe-enlarging step is performed after the sputtering of a niobium thin film, JP-A-1-231300 describes that an aluminum alloy pipe or oxygen-free copper material is subjected to both of drawing work and pipe-enlarging work to form a cavity form, and subsequently an inner surface of the cavity is subjected to mirror finishing and the inner surface of the cavity is coated with niobium by RF magnetron sputtering, thereby forming a superconducting acceleration cavity. Thus, this process described in JP-A-1-231300 is a very practical process. However, the acceleration cavity itself originally has a spherical form, so that there is caused a problem about the evenness of the film thickness distribution of the niobium thin film obtained by sputtering. There is also caused a basic problem which affects performances, an example thereof being pinholes which are frequently encountered in the form of thin films. Furthermore, as well as the process of JP-A-60-261202, there has not yet been overcome a problem of the dissolution of niobium or the reduction in the thickness of niobium which follows chemical polishing or electropolishing of the inner surface of the cavity for the purpose of removing the surface pollution of the inside of the cavity. If the film thickness is made large under consideration of dissolution loss of the niobium by the chemical polishing or the electropolishing, there are caused not only a problem about the time for forming the film but also a problem about the flatness of the surface. Moreover, as well as the case of JP-A-60-261202, a large-sized and expensive vacuum film-forming apparatus is essential. Accordingly, the production process of JP-A-1-231300 cannot be a stable process for producing a superconducting acceleration cavity since the process has many practical evil effects and cannot give a high accelerating electric field from the viewpoint of performances.

A process described in JP-A-3-274805 is a process suggested in light of drawbacks of thin niobium film forming processes as described above, wherein a vacuum film-forming apparatus (a vacuum chamber) is used. The process does not adopt the method of forming a thin film of niobium, and is a production process of forming cavity parts from a niobium thin plate of 0.3 to 1.0 mm thickness by drawing work or pressing work, integrating the parts with each other by electron beam welding to make a cavity, and then depositing copper onto the outer peripheral surface of the niobium by electroplating or thermal spraying. As a specific process thereof, suggested is a production process of coating the surface of niobium firstly with gold having a thickness of 0.1 μm or more, heating the whole surface (at 300° C. for 1 hour) in a non-oxidizing atmosphere to form diffusion layers of gold and niobium so as to cause the niobium surface and the gold to adhere closely to each other, and coating the diffusion layers with copper having a thickness of 1 to 3 mm by electroplating or plasma spraying, thereby producing a superconducting acceleration cavity. This process is basically a process of making the used niobium material merely into a thinner form, and is basically equivalent to a conventional process for producing a cavity. Furthermore, gold is coated with the niobium surface by electroplating, the gold is allowed to be thermally diffused to adhere closely to the niobium, and subsequently a cavity is finally made by copper electroplating or copper powder spraying in a plasma manner. However, supplementary experiments by the present inventors have demonstrated that the formation of a diffusion layer of gold onto niobium is not observed at the above-mentioned temperature, and no effect of improving the adhesiveness is found out. Furthermore, it is technically impossible for copper electroplating or copper spraying to assure an even film thickness on the outer peripheral surface of a superconducting acceleration cavity which is largely undulating in the shape thereof. In conclusion, the process cannot become a low cost process which cancels the effect of a reduction in the amount used of niobium material from the viewpoint of the completion degree of the process or costs. Thus, it is doubtful that the process will be realized.

Meanwhile, in recent years, as disclosed in "Development of A Seamless Superconducting High-Frequency Acceleration Cavity Using A Niobium/Copper Clad Material", pp. 12 to 15, July 2002 (Report of Grants-in-Aid for Scientific Research from Ministry of Education, Culture, Sports, Science and Technology of Japan), the following trial is being realized in the form of the development of a process for producing a seamless superconducting acceleration cavity. The trial is to simplify conventional processes of forming cavity parts from niobium material by deep drawing, cutting work or the like, and then bonding and integrating the parts with each other by electron beam welding; and to omit the expensive electron beam welding as much as possible in order to decrease costs and avoid problems descendent from welding defects, thereby attaining a high accelerating electric field. The so-called seamless acceleration cavity producing process, wherein such electron beam welded sites are decreased, is a process of using a niobium piping material (pipe member) as a starting material and forming a spherical shape peculiar to a superconducting cavity at a time by explosive forming, spinning forming, hydraulic bulge forming (hydraulic forming) or the like. Such a process is known as a known technique.

Out of the above, the forming process using the firstly-described explosive forming is a process of putting gunpowder inside a piping material and attaining the forming by pressure of an explosion. In the case of an superconducting cavity having a spherical shape, deforming pressure is applied to the inside of the niobium pipe at a moment; accordingly, only a result that the material is locally stretched is given. Thus, the thickness of the material is not even after the material is worked. Additionally, the process is involved in a serious problem that specific sites are cracked; thus, the process is not a useful process.

The secondly-described spinning forming is a process of using plate-form niobium and deforming the plate material while rotating the material along a surface of a mold member having a cavity shape, thereby working the plate material. This process makes it possible to produce a seamless cavity made of niobium and having no electron beam welded sites at least in the equator portion of the cavity; however, the inner face of the cavity is creased or cracked since the plate-form niobium is forcibly shape-worked along the surface of the mold member. Accordingly, it cannot be denied that after the formation of the cavity, surface polishing/removing work is considerably involved in order to remove the cracks or creases in the inner face. JP-A-2002-141196 is a suggestion example for producing a superconducting cavity by spinning forming.

The thirdly-described hydraulic bulge forming is a process of arranging a forming mold prepared in advance outside a seamless niobium piping material as a starting material, pushing and shortening the piping material from both ends thereof, and inserting niobium material into the mold while giving oil pressure to the inside of the piping material, whereby a spherical form is produced. This process is better than the above-mentioned two other processes although the process gives slight unevenness to the inner face of the cavity. The process is most satisfactory out of seamless cavity producing processes.

Since any of the above-mentioned seamless cavity producing processes is a process of forming a superconducting cavity directly from a niobium piping material, the processes are those improved toward an aim of decreasing electron beam bonding sites largely and attaining a high accelerating electric field. However, an acceleration cavity needs to satisfy structural requirements for a pressure vessel. As a result, the following problems are not overcome: a problem that niobium material, which is expensive, is used in a thick wall form; and a problem that a high electric resistance of niobium at normal temperature induces a local heat generation phenomenon (called a hot spot), which hinders a highly accelerating electric field at very low temperatures, to cause the quench of the superconductive state. Niobium material essentially has these problems. Japanese Patent No. 3545502 does not necessarily suggest a seamless cavity producing process, but discloses a cavity producing process to which a hydraulic bulge forming method is applied.

In order to avoid using expensive niobium material in an amount more than requires and to decrease the generation of hot spots, a new seamless cavity producing process is also being suggested. The process is that there is formed a piping material in which a metal inexpensive and good in thermal conductivity, such as copper, as a heat radiation stabilizing material is compounded into niobium on the outer peripheral region of a niobium material; and the resultant is used as a starting material.

In JP-A-2000-306697, the heat radiation stabilizing material is expressed as a good thermally-conductive material. The document discloses a seamless superconducting cavity producing process of inserting piping materials made of a good thermally-conductive material onto the outside and the inside of a seamless niobium piping material which is thinner than the good thermally-conductive material and does not have any electron beam bonded surface at all, forming a copper/niobium/copper composite piping material by a hot isostatic press bonding method (HIP method), and then subjecting this material to hydraulic bulge forming, thereby decreasing electron beam welded sites up to limitation. In this process, the role of the copper piping material, which is a cylinder inside the niobium piping material, is to prevent the niobium from deteriorating under high-temperature and high-pressure condition which accompanies the HIP bonding method. However, there remains a problem that after the end of the bulge forming, the copper piping material of the inner cylinder must be dissolved and removed with a chemical agent for dissolving copper, for example, nitric acid. Additionally, the HIP bonding method itself requires an expensive and special apparatus and further the method is basically batch working. Furthermore, the most serious problem when the HIP bonding method is applied to the production of the above-mentioned copper/niobium composite pipe is that when the inner cylinder, the niobium pipe and the outer cylinder are designed and formed in such a manner that the fitting crossing of the diameters can have a margin so as to attain the insertion of each of the cylinders and the pipe with ease, the bonding strength cannot be sufficiently kept. Accordingly, apart from the case of forming a composite piping material for a superconducting acceleration cavity having a short length in the axial direction, the HIP bonding is unsuitable for the process for producing a composite piping material for an ordinary superconducting cavity having a total length of 1 m or more.

Considering the problems of the HIP bonding method, JP-A-2002-367799 describes a process of heating a normally conductive metal material and niobium material to subject the materials to hot rolling, or hot-extruding a cylinder made of a normally conductive metal piping material and a cylinder made of niobium material together with a column while making the diameters thereof short, whereby the normally conductive metal material and the niobium material are integrated with each other to form a composite piping material for forming an acceleration cavity. However, this process is too complicated. Thus, apart from the case of carrying out mass production of clad element pipes, the process is unsuitable for the aim of lowering costs.

DISCLOSURE OF THE INVENTION

Problems to be Solved by the Invention

As described above, the conventional processes for producing a superconducting acceleration cavity and acceleration cavities produced thereby have many problems. Therefore, in this field, the followings have been desired: (1) electron beam welded sites are decreased up to a limit, and producing costs and welding defects are largely reduced; (2) defects resulting from weld lines present in the circumferential direction (the equator portionial direction) of a cavity are removed, so that a quench phenomenon based on local generation of heat is avoided to attain a high accelerating electric field; and (3) the amount used of expensive niobium material is decreased, and a local heat-generation phenomenon originating from a high resistance of niobium material is suppressed, thereby attaining a high accelerating electric field at low costs.

In order to meet these demands, the present invention provides a novel composite seamless piping material which is made of copper and niobium and has a large bonding strength permitting the material to resist against working based on hydraulic bulge forming (hydraulic bulge working), thereby embodying an acceleration cavity which can simultaneously attain low costs and a high accelerating electric field.

Means for Solving the Problems

The present inventors have considered trying to provide a novel composite seamless piping material which is made of copper and niobium and has a large bonding strength permitting the material to resist against hydraulic bulge forming, thereby embodying an acceleration cavity which can simultaneously attain low costs and a high accelerating electric field. For more detail, the present inventors have considered trying to use a niobium piping material prepared in advance, adopt a widely-usable electroforming process without using special producing facilities to embody a strong adhesiveness between electroformed copper and niobium which has not been attained up to now and produce a novel electroformed copper/niobium composite piping material which can permit a high working stress at the time of hydraulic bulge forming and an extensibility at the time of enlarging the pipe. The principle of hydraulic bulge forming is shown in FIG. 3.

No successful example has been found out in case where niobium material used for superconducting cavities is coated directly with a good thermally-conductive metal by an electroplating (electroforming) technique. JP-A-3-274805 discloses only one example of a very thin gold-plating film and copper plating by use thereof. However, it is unclear how the gold plating described in JP-A-3-274805 is carried out with the electroplating coating, which is not disclosed in JP-A-3-274805. A supplementary experiment by the present inventors has demonstrated that a gold diffusion phenomenon by thermal treatment at 300° C. as described in JP-A-3-274805 is not observed and adhesiveness of a copper plating film with interposed gold is not obtained. Since niobium is a metal having a high activity, the surface thereof is always coated with an oxide layer (passivation layer) in the atmosphere. It is well known that this is the reason why niobium material and copper resulting from electroplating cannot be easily caused to adhere closely to each other. In other words, except some metal species having a high activity, electroplating technique has a basic principle that such an oxide layer is removed by treatment with a chemical agent corresponding to a metal species, thereby metal-bonding a base metal and a metal for plating to adhere the two closely to each other.

First, the present inventors made various tests including pre-electroforming treatments up to copper electroforming, that is, tests wherein the following steps were appropriately combined: a degreasing step; an oxide layer (passivation layer) removing step=an activating step; an ordinary strike plating step as a substitution preventing measure in the case that the difference in ionization tendency between an underlying metal and an electroforming metal is large; and other steps. In particular, in the case of niobium, the difference in potential (ionization tendency) between niobium and copper used for coating is large; thus, when copper electroforming is performed immediately after the activating step, substituted copper adheres thereto. For this reason, it is supposed that some strike plating step will be necessary. It was verified that the reality was as supposed. The copper plating solution (copper electroforming bath) used in the copper electroforming was a copper sulfate bath. These tests will be described hereinafter.

1) Preparatory Test about Pre-Electroforming Treatment for causing Electroformed Copper to Adhere Closely to Niobium Material As the degreasing step for removing oily stains from the surface of niobium, immersing degreasing (nonelectrically) and electrolytic degreasing (electrically) were tried. As the activating step, the followings were tried: an oxide layer removing method wherein hydrofluoric acid was used as a chemical agent for dissolving and removing niobium or niobium oxide and the niobium material was merely immersed therein (immersing activation), a method wherein a mixed solution of hydrofluoric acid and sulfuric acid was used to electrolyze and remove the oxide anodically or electrolyze the oxide cathodically (electrolytic activation), and others. As the strike plating step to be carried out after the degreasing step and the activating step, copper strike, nickel strike and gold strike, etc. were tried. In the copper electroforming bath, the concentration of copper sulfate, that of sulfuric acid, and that of chlorine ion were from 145 to 155 g/L, from 130 to 140 g/L and from 20 to 30 mg/L, respectively. Conditions were as follows: the temperature was from 20 to 30° C., and the current density was 3 A/dm$^2$. The bath was stirred with air. The thickness of the electroformed copper was set to 0.2 mm, and the front face and the rear face of the niobium material (plate) were each coated with the electroformed copper. As the niobium material, the niobium plate for a superconducting acceleration cavity, having 10 mm width, 50 mm length and 2.5 mm thickness, was used in accept state. After the copper electroforming, a product annealed in a vacuum furnace at 300° C. for 2 hours was also produced in order to judge whether or not a diffusion layer was formed by the thermal treatment, and the effect thereof. As a method for evaluating qualitatively the adhesiveness of each of the electroformed copper layer to the niobium, there was used "Bending Test Method" of methods of adhesion test for metallic coatings described in JIS-H-8504. Whether or not the diffusion layer was present was observed on a characteristic X-ray image of a cross section of each of the evaluating samples by EPMA (electron beam microanalyzer: EPMA 8705 manufactured by Shimadzu Corp.).

The evaluation results are summarized as shown in Table 1. In this preparatory test, a combination wherein electroformed copper and niobium adhered strongly to each other was not found out.

The results in Table 1 are not necessarily satisfactory for the object of keeping the adhesiveness strong certainly. About each of the samples to which strike plating was subjected, the site wherein the electroformed copper layer was peeled off from the niobium was observed in the interface between the niobium and the strike plating layer. The above-mentioned results demonstrate that if the present inventors dare to select an appropriate method in such a state, the immersing degreasing or the cathodically electrolytic degreasing is preferred as the degreasing step. The results also demonstrate that the activating step is also preferably immersing activation, or if electrically performed, the step is preferably cathodically electrolytic. About the strike plating, nickel gives the best result among the three of nickel, copper and gold. About the effectiveness of the thermal treatment (annealing) at 300° C., the existence of a diffusion layer was not found out in any of the strike plating metals. This may be based on defective conditions. For not only niobium but also any other metals, thermal treatment for dehydrogenation after plating is carried out at 150 to 250° C. in many cases. The treatment mostly has an effect of improving the adhesiveness. However, when attention is paid only to the present niobium material and electroformed copper, the effect is not particularly observed.

Thus, the present inventors investigated, in detail, the effect of the surface finishing before the copper electroforming step, and the effects of the degreasing step, the activating step and others while the results of the preparatory test was considered

TABLE 1

| | Degreasing step | | | Activating step | | | Strike plating step | | | Annealing step after copper electro-forming (at 300° C. for 2 hours) | Evaluations of test pieces coated with electroformed copper | |
|---|---|---|---|---|---|---|---|---|---|---|---|---|
| | | Electrolytic degreasing | | | Electrolytic activation | | | | | | Evaluation result of the adhesiveness between electroformed copper and niobium | Diffusion layer into niobium |
| | Immersing degreasing | Anodic treatment | Cathodic treatment | Immersing activation | Anodic treatment | Cathodic treatment | Ni strike | Cu strike | Au strike | | | |
| 1 | ○ | — | — | ○ | — | — | ○ | — | — | — | XX | Not present |
| 2 | ○ | — | — | ○ | — | — | ○ | — | — | ○ | XX | Not present |
| 3 | ○ | — | — | ○ | — | — | — | ○ | — | — | XX | Not present |
| 4 | ○ | — | — | ○ | — | — | — | ○ | — | ○ | XXX | Not present |
| 5 | ○ | — | — | ○ | — | — | — | — | ○ | — | XX | Not present |
| 6 | ○ | ○ | — | ○ | — | — | ○ | — | — | ○ | XXX | Not present |
| 7 | ○ | ○ | — | ○ | — | — | — | — | ○ | ○ | XX | Not present |
| 8 | ○ | — | ○ | ○ | — | — | ○ | — | — | ○ | X | Not present |
| 9 | ○ | — | — | — | ○ | — | ○ | — | — | — | XX | Not present |
| 10 | ○ | — | — | — | — | ○ | ○ | — | — | ○ | X | Not present |
| 11 | ○ | — | — | — | — | ○ | — | — | ○ | ○ | XX | Not present |
| 12 | ○ | ○ | — | — | — | ○ | ○ | — | — | — | XX | Not present |
| 13 | ○ | — | ○ | — | ○ | — | ○ | — | — | — | XX | Not present |
| 14 | ○ | — | ○ | — | — | ○ | ○ | — | — | ○ | X | Not present |
| 15 | ○ | — | ○ | — | — | ○ | — | — | ○ | ○ | XX | Not present |
| 16 | — | — | ○ | ○ | — | — | ○ | — | — | ○ | X | Not present |
| 17 | — | — | ○ | — | ○ | ○ | ○ | — | — | ○ | XX | Not present |
| 18 | — | — | ○ | — | — | ○ | ○ | — | — | — | X | Not present |
| 19 | ○ | — | ○ | ○ | — | — | — | — | — | — | A blister was generated after copper electroforming. | Unable to be evaluated |

Notes:
Symbols representing the adhesiveness in the evaluation result:
X: In the bending test, electroformed copper and niobium were peeled off from each other at the stage when the test process reached the second reciprocation after the end of the first reciprocation.
XX: In the bending test, electroformed copper and niobium were peeled off from each other at the beginning of the first reciprocation.
XXX: The electroformed copper layer was "blistered" only by heating of a sample at 300° C.

for the time being. The strike plating was limited to nickel strike, which appears to be most effective. Further, the present inventors tried to verify again whether or not the annealing after copper electroforming is indeed meaningless by varying temperature conditions.

2) Test about Pretreatment and Annealing Conditions for Causing Electroformed Copper to Adhere Closely to Niobium Material As the niobium material, the same as in the above-mentioned preparatory test was used. In this test, (i) about the surface finishing of the niobium material, accept state (no finishing), #400 emery paper finishing, and sandblast finishing using a #400 emery as a polishing member were compared. (ii) Degreasing was fixed to cathodically electrolytic degreasing. (iii) About activation, the following were compared: immersing activation using hydrofluoric acid; immersing activation using nitric acid together for the purpose of promoting the effect of hydrofluoric acid; and cathodically electrolytic activation using a mixed acid of hydrofluoric acid and sulfuric acid. Conditions for the blend ratio in the case of the immersing activation using nitric acid together were as follows : the concentration of 46% hydrofluoric acid, and that of 61% nitric acid were from 50 to 100 mL/L and from 100 to 250 mL/L, respectively; the temperature was from 20 to 30° C.; and the time was from 1 to 20 minutes. Furthermore, (iv) about conditions for annealing after the copper electroforming, the following six conditions were compared: no annealing; and annealing temperatures of 300, 400, 500, 600, and 700° C. The annealing time for holding each sample in a vacuum surface was 2 hours. The composition of the copper electroforming bath, applied conditions, and the coating thickness of electroformed copper for coating were made the same as in the preparatory test 1). About the evaluation of each of the formed samples, the 90-degree bending test was made in the same way as in the preparatory test. Whether or not a diffusion layer was present was observed on a characteristic X-ray image of a cross section of each of the evaluating samples by EPMA.

Table 2 shows the results of this test 2). As the surface finishing of the niobium material, sandblast treatment was subjected while an improvement in the adhesive force by the cleanness of the surface and an increase in the bonded area was expected. However, a preferred result was not obtained, the reason for which is unclear. The present inventors dare to infer that the formation of an oxide layer to the niobium surface is preferential to the surface cleaning because of thermal impact generated by collision of the polishing member (abrasive grains) used for the sandblast to the niobium surface, and it is considered that this would produce an effect onto subsequent steps. In the activating step, the present inventors intended to use hydrofluoric acid together with an oxidizing agent (nitric acid) to dissolve the niobium surface positively to attain the activation thereof. However, in contrary to this intention, a bad effect is produced onto the adhesiveness. The reason therefor would be that when a method of using a chemical agent for oxidizing niobium positively or a method of subjecting niobium to anodically electrolytic treatment in the activating step, a strong oxide layer is conversely formed on the niobium. As an experiment for verifying this matter, which is not particularly described in Table 2, the following was carried out: instead of the immersing activation using hydrofluoric acid and nitric acid together, a mixed solution of hydrofluoric acid and sulfuric acid was used to subject niobium to anodically electrolytic activating treatment, and the resultant was annealed at 600° C. As a result, it was verified that the effect of the annealing was lost. It is understood from the evaluation results of the adhesiveness according to the 90-degree bending test that the effect of annealing onto the electroformed copper layer and the niobium starts to make its appearance from 400° C. However, according to the characteristic X-ray image by EPMA, the existence of a diffusion layer was not recognized at 400° C., and it was not recognized until the temperature reached 500° C. However, the diffusion of nickel or copper to the niobium side was hardly recognized, and nickel diffused exclusively to the electroformed copper layer side. Accordingly, it cannot be said that an improvement in the adhesiveness between the niobium and copper by the annealing is merely based on the formation of a diffusion layer.

TABLE 2

| | Niobium plate material surface-finishing step | | | Degreasing step | Activating step | | | Strike plating |
|---|---|---|---|---|---|---|---|---|
| No | Accept state | #400 emery paper | #400 emery blast | Cathodically electrolytic degreasing | HF immersing activation | HF—$HNO_3$ immersing activation | Cathodically electrolytic activation | step Ni strike |
| 1 | ○ | — | — | ○ | ○ | — | — | ○ |
| 2 | ○ | — | — | ○ | ○ | — | — | ○ |
| 3 | ○ | — | — | ○ | ○ | — | — | ○ |
| 4 | ○ | — | — | ○ | ○ | — | — | ○ |
| 5 | ○ | — | — | ○ | ○ | — | — | ○ |
| 6 | ○ | — | — | ○ | ○ | — | — | ○ |
| 7 | — | ○ | — | ○ | ○ | — | — | ○ |
| 8 | — | ○ | — | ○ | ○ | — | — | ○ |
| 9 | — | ○ | — | ○ | ○ | — | — | ○ |
| 10 | — | — | ○ | ○ | ○ | — | — | ○ |
| 11 | — | ○ | — | ○ | — | ○ | — | ○ |
| 12 | — | ○ | — | ○ | — | — | ○ | ○ |
| 13 | — | — | ○ | ○ | ○ | — | — | ○ |
| 14 | ○ | — | — | ○ | — | ○ | — | ○ |

| | Annealing step (kept for 2 hours) | | | | | | Evaluation results after copper electroforming | |
|---|---|---|---|---|---|---|---|---|
| No | None | 300° C. | 400° C. | 500° C. | 600° C. | 700° C. | Adhesiveness | Diffusion |
| 1 | ○ | — | — | — | — | — | XX | Not present |
| 2 | — | ○ | — | — | — | — | X | Not present |

TABLE 2-continued

| | | | | | | | | |
|---|---|---|---|---|---|---|---|---|
| 3 | — | — | ○ | — | — | — | Δ | Not present |
| 4 | — | — | — | ○ | — | — | ○ | Present in the copper side |
| 5 | — | — | — | — | ○ | — | ○ | Present in the copper side |
| 6 | — | — | — | — | — | ○ | ○ | Present in the copper side |
| 7 | ○ | — | — | — | — | — | XX | Not present |
| 8 | — | — | ○ | — | — | — | Δ | Not present |
| 9 | — | — | — | — | ○ | — | ○ | Present in the copper side |
| 10 | — | — | — | — | ○ | — | Δ | Not present |
| 11 | — | — | — | — | ○ | — | X | Not present |
| 12 | — | — | — | — | ○ | — | ○ | Present in the copper side |
| 13 | — | — | — | — | — | ○ | Δ | Present in the copper side |
| 14 | — | — | — | — | ○ | — | X | Not present |

Notes:

(1) Description of symbols in the adhesiveness column for the evaluation results:

XX: In the bending test, electroformed copper and niobium were peeled off from each other at the beginning of the first reciprocation.

X: In the bending test, electroformed copper and niobium were peeled off from each other when the test process reached the second reciprocation after the end of the first reciprocation.

Δ: When the bending was repeated, the electroformed copper layer was peeled off in the fourth reciprocation.

○: When the bending was repeated, the electroformed copper layer was not peeled off at all even if the niobium material underwent fatigue breaking (breaking in the seventh reciprocation).

(2) Description in the diffusion column for the evaluation results

Present in the copper side: in the characteristic X-ray image, nickel or copper did not diffuse at all to the niobium side but nickel diffused or penetrated into the electroformed copper side.

Summarizing the above-mentioned results, it was found out the following: a process for coating niobium material with an electroformed copper layer excellent to adhesiveness thereto cannot be attained until: a step so as not to oxidize the niobium surface positively is adopted in each step up to the formation of the electroformed copper layer; the niobium is coated with the electroformed copper layer with strike plating, based on nickel, interposed therebetween; and next the resultant is annealed at a temperature of 400° C. or higher, more preferably 500° C. or higher, in an atmosphere which does not make copper oxidize. In this way, a prospect of a production of the electroformed copper/niobium composite piping material of the present invention was gained.

3) Test on the Adhesive Strength Between the Electroformed Copper Layer and the Niobium Material As described above, the method for causing electroformed copper and niobium to adhere strongly to each other was developed. In order to grasp quantitatively an actual degree of the adhesive strength, this test 3) was made. First, a pure niobium plate, 120 mm×100 mm×10 mm, was prepared, and a single surface thereof was polished with a # 400 emery paper. Then, the plate was subjected to a process regarded as the best process from the tests 1) and 2), that is, the process of subjecting the niobium surface to immersing degreasing, washing the surface with water, subjecting the surface to cathodically electrolytic degreasing, washing the surface with water, subjecting the surface to cathodically electrolytic activation by using a mixed solution of sulfuric acid and hydrofluoric acid, washing the surface with water, and subjecting the surface to nickel strike plating. A copper sulfate bath was used to coat the resultant with an electroformed copper layer up to a target thickness, which was 3 mm. Thereafter, discharge wire cutting was used to divide the resultant into small pieces of 20 mm width, 50 mm length and (10 mm+electroformed copper layer thickness) thickness, and then the following small pieces (of five types) were formed: small pieces obtained by subjecting the above-mentioned pieces to vacuum annealing treatment under 4 conditions of at 400° C. for 2 hours, at 500° C. for 2 hours, at 600° C. for 2 hours, and at 700° C. for 2 hours, and to no annealing treatment. Two pieces were formed per type. At last, milling work was used to form test pieces for "Shear Test" prescribed in a method for testing clad steel described in JIS-G-0601, as illustrated in FIG. 4, and then a universal tensile test machine (Autograph AG10TB model, manufactured by Shimadzu Corp.) was used to measure the shear strength. The sheared sites were each checked. As a result, the niobium and the electroformed copper layer were certainly bonded with each other at a temperature of 500° C. or higher. When a composite piping material was formed in the same way, it was demonstrated that the pipe would be able to resist against subsequent hydraulic bulge forming sufficiently (see Table 3).

TABLE 3

| Annealing condition | No. | Shear strength ($kg/mm^2$) | Sheared site |
|---|---|---|---|
| no annealing | 1 | 3.5 | Interface between niobium and the electroformed copper layer |
| | 2 | 4.2 | Interface between niobium and the electroformed copper layer |
| 400° C. × 2 hours | 1 | 10.8 | Interface between niobium and the electroformed copper layer |
| | 2 | 11.9 | Interface between niobium and the electroformed copper layer |
| 500° C. × 2 hours | 1 | 18.2 | Inside of the electroformed copper layer |
| | 2 | 19.8 | Inside of the electroformed copper layer |
| 600° C. × 2 hours | 1 | 17.6 | Inside of the electroformed copper layer |
| | 2 | 17.2 | Inside of the electroformed copper layer |
| 700° C. × 2 hours | 1 | 15.7 | Inside of the electroformed copper layer |
| | 2 | 15.1 | Inside of the electroformed copper layer |

Conditions for coating niobium material with a thick copper layer by electroforming so as to adhere the two closely to each other were found out so that it became possible to produce an electroformed copper/niobium composite piping material. A substance which can be preferably used for electrolytic activation and is alternative to hydrofluoric acid includes ammonium fluoride, potassium fluoride, sodium fluoride and the like, which has not been particularly referred to in the tests 1) to 3). The following nickel strike conditions can also produce the same good results: the concentration of nickel sulfate and that of sulfuric acid are from 150 to 300 g/L and from 10 to 100 mL/L, respectively, the temperature is from 20 to 30° C., and the used current density is from 5 to 20 A/dm$^2$.

As a copper electroforming bath other than the exemplified copper sulfate bath, the following can be used, considering enlarging rates in hydraulic bulge forming: a bath and conditions making it possible to form a coating of an electroformed layer having a rupture elongation of 20% or more, more preferably 40% or more after the layer is annealed at a temperature of at lowest 400° C. or higher. The thickness of the electroformed copper layer which should be used for the coating can be controlled as the need arises. In many cases, it is sufficient that the thickness ranges from 0.2 to 4.0 mm.

4) Test on the Elongation of an Electroformed Copper Layer

As a further test, a test for verifying the degree of the elongation against which the electroformed copper layer can resist was made. First, an A5052 aluminum alloy plate having an A4 size and a thickness of 10 mm was prepared. A single surface thereof was subjected to pre-treatment (zincate treatment) for aluminum. The resultant underwent the step of plating the surface with nickel up to a thickness of about 2 μm, and then coated with an electroformed copper layer up to a target thickness, which was 3 mm, in a copper sulfate bath. Thereafter, the electroformed copper surface was made smooth by milling, and the aluminum material which became unnecessary was removed by milling while the material was left by a thickness of 1 mm. Subsequently, milling was again performed to cut away the resultant into pieces each having the shape of a tensile test piece No. 13B described in JIS-Z-2201. From each of the cut test pieces, the remaining aluminum portion was dissolved and removed with a 20% by mass aqueous sodium hydroxide solution, and then the nickel thin film remaining on the electroformed copper layer was removed with an emery paper. Thereafter, the following tensile test pieces of four types were obtained: tensile test pieces obtained by subjecting the above-mentioned pieces to vacuum annealing treatment under 3 conditions of at 500° C. for 2 hours, at 600° C. for 2 hours, and at 700° C. for 2 hours, and to no annealing treatment. About each of the test pieces, a universal tensile test machine (Autograph AG10TB model, manufactured by Shimadzu Corp.) was used to make a tensile test at a tensile rate of 2 mm/minute, so as to measure the rupture elongation and the tensile strength. In this test, four aluminum plates were prepared, and the plates were each coated with an electroformed copper layer in turn. In each of the aluminum plates, each of the above-mentioned four-type test pieces was formed, whereby four test pieces were tested under each condition. The average value was then calculated. The results are shown in Table 4.

TABLE 4

| Annealing condition | Rupture elongation (%) | Tensile strength (kg/mm$^2$) |
|---|---|---|
| No annealing | 34.1 | 23.6 |
| 500° C. × 2 hours | 55.2 | 21.8 |
| 600° C. × 2 hours | 57.3 | 21.4 |
| 700° C. × 2 hours | 56.5 | 21.3 |

As shown in Table 4, it is understood that the electroformed copper layer subjected to vacuum annealing treatment at 500° C. or higher exhibits a rapture elongation far higher than 40% so as to have an elongation which can sufficiently correspond to an elongation in hydraulic bulge forming. While the tensile strength of niobium material for forming a superconducting acceleration cavity ranges usually from about 16 to 19 kgf/mm$^2$, the tensile strength of the electroformed copper layer is somewhat higher than the range. Thus, it is understood that even if the niobium material is made thin, the strength thereof can be supplemented by the thickness of the electroformed copper layer.

In an application of the present invention, it is needless to say that in the middle of the production of an electroformed copper/niobium composite piping material, that is, at a stage up to annealing after the electroformed copper layer is coated, an electroformed copper layer and a niobium piping material can be also bonded to each other by use of HIP bonding method instead of the annealing.

In other words, the present invention relates to essentially a process for coating a niobium piping material with copper; thus, it does not become necessary at all to care about the fitting precision between a copper pipe and a niobium pipe as when the process of JP-A-2000-306697 described above is carried out. After an electroformed copper layer is formed, copper and niobium are present closely to each other, which is most ideal for HIP bonding method. In this case, when the electroformed copper layer is formed, copper electroforming coating should be performed with anodes arranged on the inner and outer surfaces of the niobium piping material in order to avoid a deterioration of niobium at high temperature and high pressure, which is a drawback of HIP bonding method. However, an excess of copper on the inner surface must be finally removed with nitric acid or the like. This generates futility. However, when HIP bonding method is applied to an electroformed copper/niobium piping material, there are generated advantages that the piping material is released from a problem about the dimensional precision for fitting a copper piping material and a niobium piping material to each other and a restriction of the length thereof.

After the acquisition of the above-mentioned various findings, the present inventors have repeated further investigations to make the present invention.

That is, the present invention relates to the following matters:

(1) A process for producing an electroformed copper/niobium composite piping material, characterized by that any one or each of an outer peripheral surface and an inner peripheral surface of a niobium thin piping material is coated with a nickel thin film, a surface of the nickel thin film is coated with copper by electroforming, and subsequently the thin piping material is annealed;

(2) The process according to the above (1), wherein the niobium thin piping material is a material formed and worked so as to set the number of seams along an axial direction of the piping material to 1 or less;

(3) The process according to the above (1) or (2), wherein the niobium thin piping material, which constitutes the electroformed copper/niobium composite piping material, has a wall thickness of 0.2 to 1.5 mm, a diameter of 100 to 600 mm, and a length of 200 to 4,000 mm;

(4) The process according to any one of the above (1) to (3), characterized by that before the coating with the nickel thin film, cleaning of the niobium thin piping material is performed so as not to promote oxidization of the surface of the niobium thin piping material;

(5) The process according to any one of the above (1) to (4), wherein the coating with the nickel thin film is performed by electroplating;

(6) The process according to any one of the above (1) to (5), wherein the annealing is performed in a non-oxidizing atmosphere;

(7) The process according to any one of the above (1) to (6), wherein an electroformed copper layer has a film thickness of the film coated of 0.2 mm or more;

(8) The process according to any one of the above (1) to (7), characterized by that after the annealing, the copper-electroformed outer peripheral surface is further subjected to mechanical work to adjust shape precision thereof, and thereby the piping material is subjected to hydraulic bulge forming for cavity-formation;

(9) The producing process according to any one of the above (1) to (8), wherein the film thickness of the nickel thin film ranges from 0.05 to 5 μm;

(10) The process according to any one of the above (1) to (9), wherein the annealing is performed at 400° C. or more;

(11) A process for producing an electroformed copper/niobium composite piping material, characterized by that any one or each of an outer peripheral surface and an inner peripheral surface of a niobium thin piping material is coated with a nickel thin film, a surface of the nickel thin film is coated with copper by electroforming, and an electroformed copper layer and a niobium film piping material are bonded to each other, with the nickel thin film interposed therebetween, by an HIP bonding method;

(12) The process according to any one of the above (1) to (11), wherein the electroformed copper/niobium composite piping material is a material to be supplied for forming a superconducting acceleration cavity;

(13) A process for producing a superconducting acceleration cavity, characterized by that the electroformed copper/niobium composite piping material obtained by the process according to any one of the above (1) to (12) is subjected to hydraulic bulge forming;

(14) An electroformed copper/niobium composite piping material, wherein an electroformed copper layer is bonded to any one or each of an outer peripheral surface and an inner peripheral surface of a niobium thin piping material with a nickel thin film interposed therebetween;

(15) An electroformed copper/niobium composite piping material, which is produced by the process according to any one of the above (1) to (12);

(16) A superconducting acceleration cavity, which is obtained by subjecting an electroformed copper/niobium composite piping material obtained by the process according to any one of the above (1) to (12) to hydraulic bulge forming; and

(17) A process for bonding an electroformed copper layer and a niobium thin piping material, characterized by that a composite piping material, in which any one or each of an outer peripheral surface and an inner peripheral surface of the niobium thin piping material is coated with a nickel thin film and further the electroformed copper layer is formed on a surface of the nickel thin film, is annealed at a temperature of 400° C. or more, thereby bonding the electroformed copper layer and the niobium thin piping material.

According to the producing process of the present invention, an electroformed copper/niobium composite piping material, in particular, a composite piping material wherein no or few seams are present can be industrially advantageously produced. Moreover, in the electroformed copper/niobium composite piping material of the present invention, a niobium piping material and electroformed copper are bonded to each other with a nickel thin film interposed therebetween; therefore, the adhesiveness between the electroformed copper and the niobium thin piping material is high, and the composite piping material can resist sufficiently against pipe-enlargement based on hydraulic bulge forming. Accordingly, the present invention is in particular useful for the material of a superconducting acceleration cavity.

DESCRIPTION OF REFERENCE NUMERALS

Figure 1:
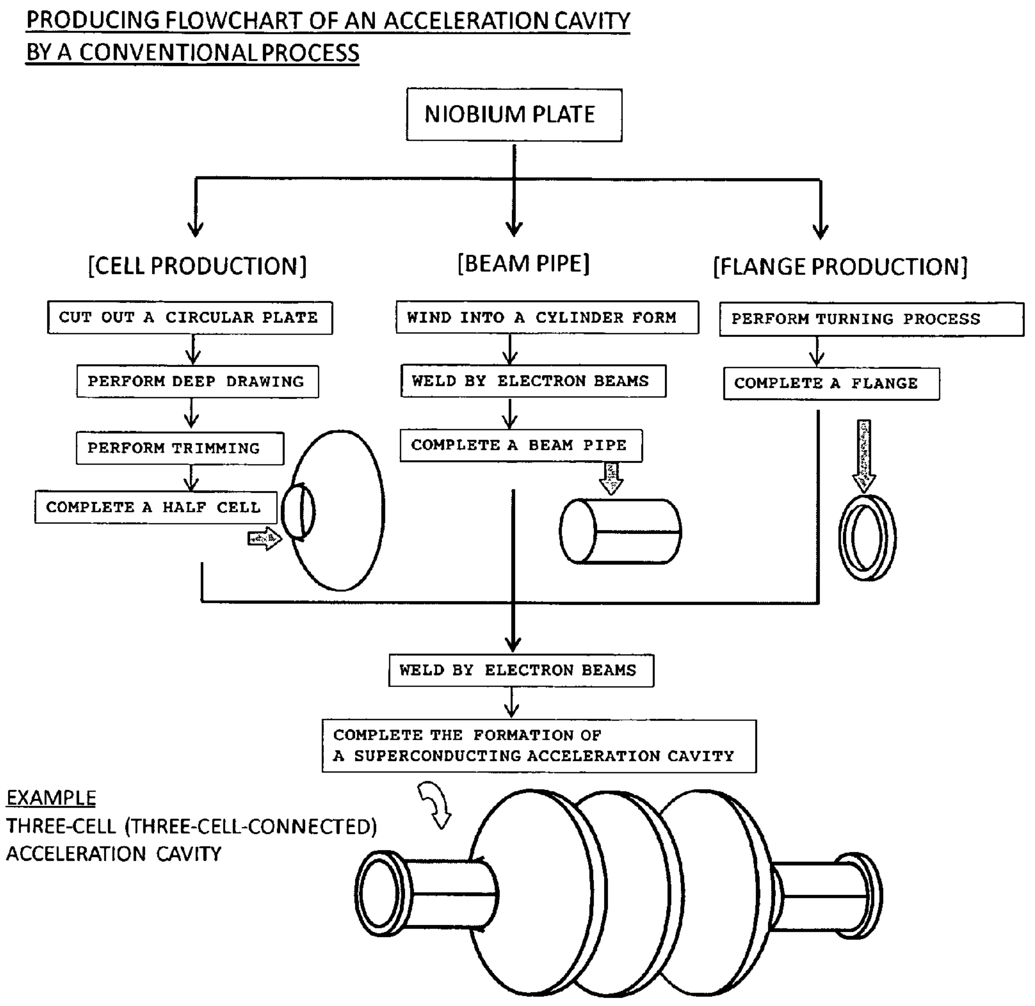
FIG. 1 is a producing flowchart of a conventional superconducting acceleration cavity formed by bonding/integrating parts each produced from a niobium plate material by making good use of a plate-winding process, a deep drawing process, a turning process, and so on with each other by electron beam welding.
Figure 2:
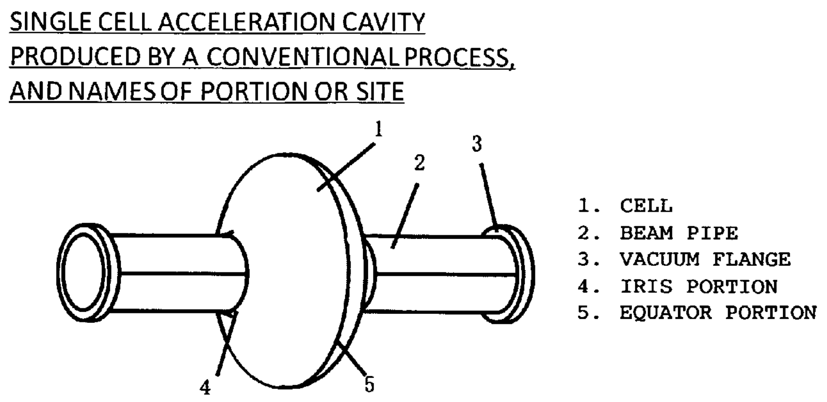
FIG. 2 is a view showing a single-cell superconducting acceleration cavity produced by a conventional process, and names of its portion or site.
Figure 3:
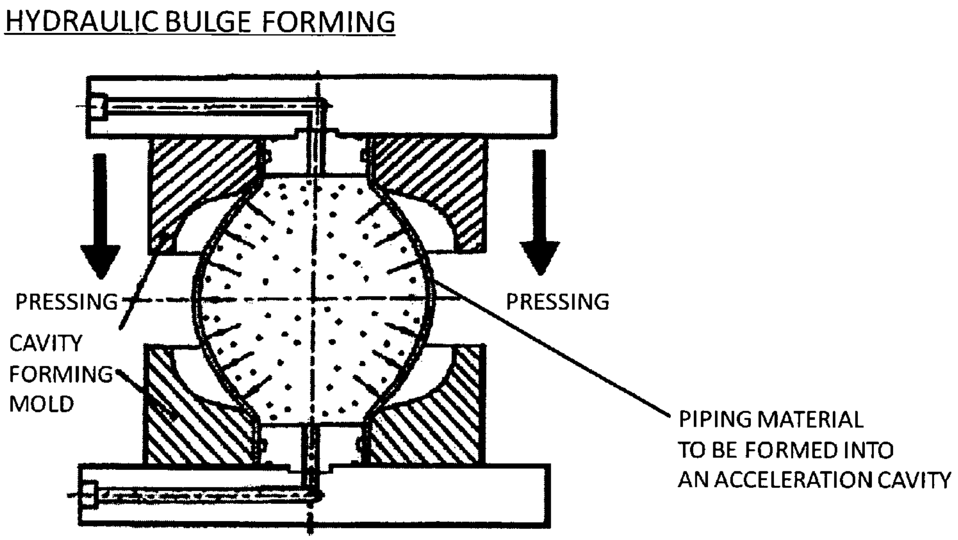
FIG. 3 is a view showing the principle of hydraulic bulge forming.
Figure 4:
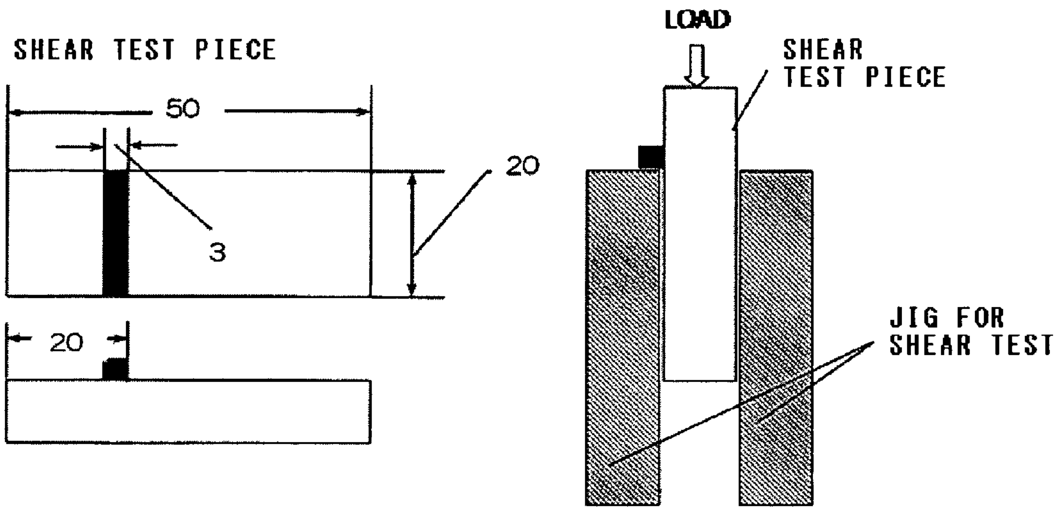
FIG. 4 is a view illustrating the shape of a shear test piece and a testing method for evaluating the adhesiveness of an electroformed copper layer of a composite body made of the electroformed copper layer and niobium. In the figure, each numerical value represents a length (mm).
Figure 5:
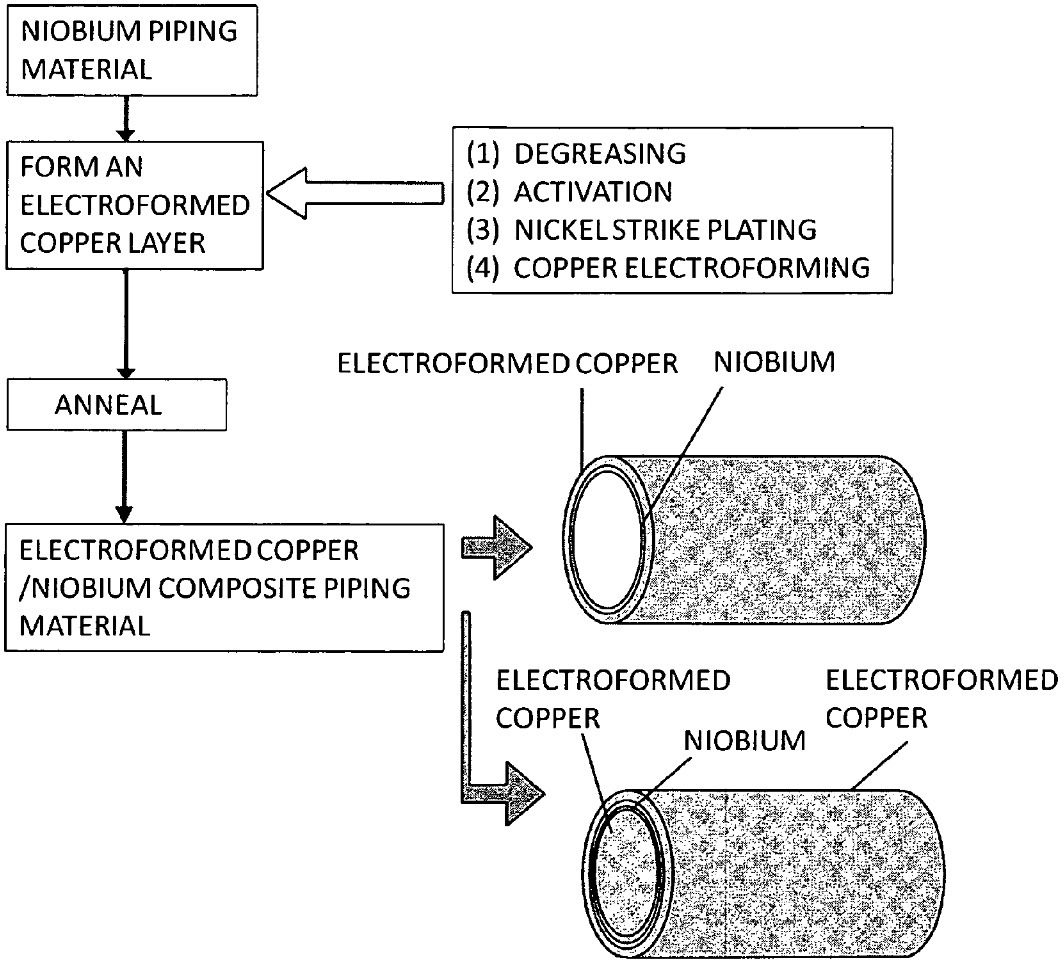
FIG. 5 is a preferred producing flowchart of the electroformed copper/niobium composite piping material of the present invention.

1 cell
2 beam pipe
3 vacuum flange
4 iris portion
5 equator portion

BEST MODE FOR CARRYING OUT THE INVENTION

The process for producing an electroformed copper/niobium composite piping material of the present invention is a process characterized by that any one or each of the outer peripheral surface and the inner peripheral surface of a niobium thin piping material, preferably the outer peripheral surface optionally together with the inner peripheral surface, is coated with a nickel thin film (a nickel coating step), the surface of the nickel thin film is coated with copper by electroforming (copper electroforming step), and subsequently the resultant is annealed (an annealing step). The niobium thin piping material and each of the steps will be described hereinafter.

Niobium Thin Piping Material

The niobium thin piping material used in the present invention is most preferably a piping material which is essentially seamless. However, it is very difficult to constantly obtain a piping material having a pipe diameter about which considerations are made for the beam pipe diameter and the cell equator portion diameter required from the design of an acceleration cavity. For this reason, it is allowable to use, for example, a piping material obtained from a niobium plate material by performing a plate-winding process and then welding the butting faces thereof by electron beams. In this case, the cell portion of an acceleration cavity will not have a completely seamless structure, and only one seam will be present along the axial direction of the piping material. However, the generation rate of defects becomes far lower than at least in the case that electron beam welding is carried out along the entire circumference of the equator portion of the cell. It is therefore preferred that the niobium thin piping material used in the present invention is a piping material formed to have one seam or less along the piping material axial direction. About preferred dimensions of the niobium thin piping material, the wall thickness is from 0.2 to 1.5 mm, the diameter is from 100 to 600 mm, and the length is from 200 to 4,000 mm. The above-mentioned "diameter" means the inner diameter.

In the present invention, it is preferred that before the niobium thin piping material is subjected to the nickel coating step, the niobium thin piping material is subjected to a cleaning step so as not to promote the oxidization of the surface thereof. The cleaning step is carried out, for example, by subjecting the niobium thin piping material to degreasing treatment under conditions so as not to make the material into a passive state, and then activating the resultant. Before the degreasing treatment step, it is allowable to polish the niobium thin piping material to conduct the surface-finishing treatment of the niobium thin piping material.

The polishing means in the surface-finishing treatment may be a known polishing means. The polishing is preferably performed in a wet manner in order to restrain frictional heat. It is advisable to perform the polishing just before the degreasing treatment. It is also allowable that before the polishing, foreign substances on the surface are removed or the surface is made flat and smooth by a chemical surface treatment, for example, chemical polishing or electropolishing.

The degreasing treatment is conducted under conditions so as not to promote the oxidization of the surface of the niobium thin piping material. The "conditions so as not to promote the oxidization of the surface of the niobium thin piping material" widely mean conditions so as not to oxidize the surface of the niobium thin piping material positively. Thus, the surface of the niobium thin piping material may be partially oxidized. The degreasing means is not particularly limited as long as the objects of the present invention are not hindered. The means maybe known degreasing means such as immersing degreasing, or cathodically electrolytic degreasing. On the contrary, anodically electrolytic degreasing is not preferred since the surface may be positively oxidized.

The above-mentioned activating treatment is not particularly limited as long as the objects of the present invention are not hindered. The treatment may be a known activating treatment. For example, immersing activating treatment without oxidizing agent is preferred. Since an oxidizing agent may promote the formation of an oxide layer on the surface, the immersing activating treatment without using this agent is preferred as described above. Cathodic electrolytic activating treatment is also preferred. On the contrary, anodically electrolytic activating treatment is not preferred since the surface may be positively oxidized.

Nickel Coating Step

In the present step, any one or each of the outer peripheral surface and the inner peripheral surface of the above-mentioned niobium thin piping material, preferably the outer peripheral surface optionally together with the inner peripheral surface, is coated with a nickel thin film. The coating with the nickel thin film may be performed in an ordinary manner. The coating is preferably performed by electroplating. Nickel strike plating is particularly preferred. Ion plating is also preferred except a problem that a vacuum chamber must be used.

The film thickness of the nickel thin film obtained in this step preferably ranges from 0.05 to 5 μm.

Copper Electroforming Step

In the present step, the surface of the nickel thin film on the niobium thin piping material, which is coated with the nickel thin film obtained in the nickel coating step, is coated with copper by electroforming. The copper plating bath used in the step is not particularly limited as long as the objects of the present invention are not hindered. The bath is preferably a copper sulphate bath. The film thickness of copper formed as the coating is preferably 0.2 mm or more. The upper limit of the film thickness does not need to be decided; it is usually sufficient that the limit is about 4 mm or less. However, it is permissible that the limit is over 4 mm.

Annealing Step

In the present step, the copper/nickel/niobium thin piping material, which is obtained in the copper electroforming step, is annealed. According to the step, it is possible to strengthen the joint between the electroformed copper layer and the niobium thin piping material with the nickel thin film interposed therebetween. The annealing is usually performed by thermal treatment, and is preferably performed in a non-oxidizing atmosphere. The temperature for the annealing is usually 400° C. or higher, preferably 500° C. or higher, more preferably from 500 to 800° C.

In the present invention, the electroformed copper layer and the niobium thin piping material may be bonded strongly to each other by using HIP bonding method instead of the annealing.

Table 5 shows compositions of an immersing degreasing solution, an electrolytic degreasing solution, an immersing activating solution, an electrolytic activating solution, a nickel strike solution and a copper plating bath which are preferred in the present invention; and applied conditions.

TABLE 5

| Chemical solution name | Chemical solution composition and applied condition | |
|---|---|---|
| Immersing degreasing solution | (1) Composition: | PAKUNA #312 30 to 50 g/L |
| | (2) Temperature: | 40 to 60° C. |
| | (3) Time: | 2 to 15 minutes |
| Electrolytic degreasing solution | (1) Composition: | PAKUNA ELECTOR Z-1 40 to 60 g/L Sodium hydroxide 40 to 60 g/L |
| | (2) Temperature: | 20 to 30° C. |
| | (3) Current density: | 3 to 5 A/dm$^2$ in each of cathodic and anodic treatments |
| | (4) Time: | 3 to 6 minutes |
| | (5) Counter electrode: | carbon |
| Immersing activating solution | (1) Composition: | 46% hydrofluoric acid 50 to 300 mL/L |
| | (2) Temperature: | 20 to 35° C. |
| | (3) Time: | 1 to 15 minutes |
| Electrolytic activating solution | (1) Composition: | 97% sulfuric acid 80 to 300 mL/ 46% hydrofluoric acid 20 to 100 mL/L |
| | (2) Temperature: | 20 to 35° C. |
| | (3) Current density: | 1 to 10 A/dm$^2$ in each of cathodic and anodic treatments |
| | (4) Time: | 1 to 10 minutes |
| | (5) Counter electrode: | aluminum or nickel |
| Nickel strike solution | (1) Composition: | nickel chloride 150 to 300 g/L 37% hydrochloric acid 50 to 150 g/L |
| | (2) Temperature: | 20 to 40° C. |
| | (3) Current density: | 2 to 15 A/dm$^2$ |
| | (4) Time: | 0.5 to 8.0 minutes |
| | (5) Anode: | nickel |
| Copper plating bath | (1) Composition: | copper sulfate 145 to 155 g/L sulfuric acid 130 to 140 g/L |

TABLE 5-continued

| Chemical solution name | Chemical solution composition and applied condition | |
|---|---|---|
| | | chlorine ion |
| | | 20 to 30 mg/L |
| | (2) Temperature: | 20 to 30° C. |
| | (3) Current density: | 3 to 6 A/$dm^2$ |

Notes:
In the table, PAKUNA #312 and PAKUNA ELECTOR Z-1 are each a degreasing agent manufactured by Yuken Industry Co., Ltd.
"PAKUNA" is a registered trade name of the company.

The electroformed copper/niobium composite piping material obtained according to the present invention as described above is usually supplied to form a superconducting acceleration cavity. It is preferred to subject the piping material to a hydraulic bulge forming for forming a cavity, that is, a processing based on hydraulic bulge forming. When the outer peripheral surface of the electroformed copper layer is mechanically worked after the annealing, thereby adjusting the shape precision, the shape precision of the inner surface of a cavity to be formed is further improved.

From the electroformed copper/niobium composite piping material as mentioned above, a superconducting acceleration cavity can be produced in an ordinary manner. The superconducting acceleration cavity obtained by subjecting the electroformed copper/niobium composite piping material to hydraulic bulge forming is also one aspect of the invention. It is advisable to perform the hydraulic bulge forming in an ordinary manner.

When the electroformed copper/niobium composite piping material obtained by use of HIP bonding method is used to produce a superconducting acceleration cavity, there is usually used a cavity wherein a nickel thin film and an electroformed copper layer are formed on each of the outer peripheral surface and the inner peripheral surface of a niobium thin piping material. In this case, it is advisable to remove the nickel thin film and the electroformed copper layer formed on the inner peripheral surface before or after hydraulic bulge forming.

EXAMPLES

Example 1

A niobium plate of 1.0 mm thickness, 500 mm length and 400 mm width was subjected to a plate-winding process, and the joint was subjected to electron beam welding (EBW) to form a niobium piping material of 127 mm diameter and 500 mm length. The surface of the niobium piping material was subjected to wet polishing finishing with a #400 emery paper. Thereafter, an electrolytic degreasing solution, an electrolytic activating solution and a nickel strike plating solution and applied conditions described in below Table 6 were used to conduct cathodically electrolytic degreasing treatment and cathodically electrolytic activating treatment. Then, the resultant was coated with nickel strike plating. Next, under conditions that the concentration of copper sulfate, that of sulfuric acid and that of chlorine ion were 152 g/L, 135 g/L and 20 mg/L, respectively, the temperature was 25° C. and a current density was 3 A/$dm^2$, the niobium thin piping material was coated with electroformed copper up to a target thickness 3.5 mm, while the niobium piping material was rotated. In this way, a copper/nickel/niobium composite piping material was produced. The composite piping material was subjected to discharge wire cutting so as to cut away 7 cylindrical samples of 60 mm height. One of the samples was not annealed and was kept in the state that the copper was electroformed. The other six samples were subjected to vacuum annealing at 400° C. for 1 hour and 24 hours, 500° C. for 1 hour and 24 hours, 600° C. for 1 hour and 700° C. for 1 hour, respectively. In this way, 7 types of electroformed copper/niobium composite piping materials were produced.

TABLE 6

| Chemical solution name | Chemical solution composition and applied condition | |
|---|---|---|
| Immersing degreasing solution | (1) Composition: | PAKUNA #312 |
| | | 40 g/L |
| | (2) Temperature: | 50° C. |
| | (3) Time: | 5 minutes |
| Electrolytic degreasing solution | (1) Composition: | PAKUNA ELECTOR Z-1 |
| | | 50 g/L |
| | | Sodium hydroxide |
| | | 50 g/L |
| | (2) Temperature: | 20° C. |
| | (3) Current density: | 5 A/$dm^2$ in each of cathodic and anodic treatments |
| | (4) Time: | 5 minutes |
| | (5) Counter electrode: | carbon |
| Immersing activating solution | (1) Composition: | 46% hydrofluoric acid |
| | | 100 mL/L |
| | (2) Temperature: | 25° C. |
| | (3) Time: | 10 minutes |
| Electrolytic activating solution | (1) Composition: | 97% sulfuric acid |
| | | 100 mL/L |
| | | 46% hydrofluoric acid |
| | | 80 mL/L |
| | (2) Temperature: | 25° C. |
| | (3) Current density: | 5 A/$dm^2$ in each of cathodic and anodic treatments |
| | (4) Time: | 5 minutes |
| | (5) Counter electrode: | aluminum |
| Nickel strike solution | (1) Composition: | nickel chloride |
| | | 240 g/L |
| | | 37% hydrochloric acid |
| | | 100 g/L |
| | (2) Temperature: | 25° C. |
| | (3) Current density: | 10 A/$dm^2$ |
| | (4) Time: | 5 minutes |
| | (5) Anode: | nickel |

Notes:
In the table, PAKUNA #312 and PAKUNA ELECTOR Z-1 are each a degreasing agent manufactured by Yuken Industry Co., Ltd.

From each of the electroformed copper/niobium composite piping materials obtained as described above, three test pieces of 15 mm width and 60 mm length (the height direction of the cylinder was made consistent with the length direction of the test pieces). The three pieces were each subjected to the 90-degree bending test.

From the material of 127 mm diameter and 80 mm length remaining when the cylindrical samples 60 mm high were cut away, 21 test pieces of 5 mm width and 10 mm length (the height direction of the cylinder was made consistent with the length direction of the test pieces) were collected by discharge wire cutting. In the same way as in the process for forming the above-mentioned 90-degree bending test pieces, the following samples were formed: samples, without being annealed, kept in the state that the copper was electroformed; and samples subjected to vacuum annealing at 400° C. for 1 hour and 24 hours, 500° C. for 1 hour and 24 hours, 600° C. for 1 hour and 700° C. for 1 hour, respectively. The number of the samples formed under each of these conditions was three. The samples were subjected to remaining hydrogen analysis. In the method for analyzing hydrogen, a hydrogen concentration analyzing device (RH404, manufactured by LECO Co.) was used. Table 7 together shows adhesiveness evaluations based on the 90-degree bending test, and the measurement result of the hydrogen concentration (absorbed hydrogen) present in each of the electroformed copper/niobium composite piping materials.

TABLE 7

(Average values of the test piece number n = 3)

| Annealing conditions for the electroformed copper/niobium composite piping material | Adhesiveness evaluation | Hydrogen absorbed in the electroformed copper/niobium composite piping material |
|---|---|---|
| No annealing | XX | 48 ppm |
| 400° C. × 1 hour | X~Δ | 23 ppm |
| 400° C. × 24 hours | X~Δ | 21 ppm |
| 500° C. × 1 hour | ○ | 10 ppm |
| 500° C. × 24 hours | ○ | 11 ppm |
| 600° C. × 1 hour | ○ | 7 ppm |
| 700° C. × 1 hour | ○ | 8 ppm |

Notes:
Description of symbols:
XX: In the bending test, the electroformed copper layer and niobium were peeled off from each other at the beginning of the first reciprocation.
X: In the bending test, the electroformed copper layer and niobium were peeled off from each other at the stage when the test process reached the second reciprocation after the end of the first reciprocation.
Δ: When the bending was repeated, the electroformed copper layer and niobium were peeled off from each other in the fourth reciprocation.
○: When the bending was repeated, the electroformed copper layer was not peeled off even if the niobium material underwent fatigue breaking.

It is understood from Table 7 that the annealing after the electroforming is very important for keeping the adhesiveness certainly, the effect based on the annealing is gradually recognized from 400° C., and at 500° C. or higher very stable adhesiveness is shown. When this is compared to the absorbed hydrogen amount, it has been discovered that the hydrogen amount in such a composite piping material comes to be stable at a low level from 500° C. Accordingly, it would be proper to consider that the effect based on dehydrogenation rather than the formation of a diffusion layer contributes to the adhesiveness although it has not been verified how the adhesiveness and the amount of hydrogen present in the composite piping material interact on each other or where the hydrogen is present.

As described above, in the electroformed copper layer giving such a good adhesiveness that the niobium material is not peeled away even if the niobium material undergoes fatigue breaking in the 90-degree bending test, sheared sites are not in the interface between the niobium and the electroformed copper layer but are inside the electroformed copper layer in the shear strength test, so that a high shear strength value is shown in the test also. It can also be verified in another tensile test that the elongation of this electroformed copper layer is over 40%. It is therefore clear that the composite piping materials in the examples showing such good adhesiveness can resist against hydraulic bulge forming.

As described above, in the present invention, adopted are the step of subjecting the surface of a niobium piping material to physical working so as not to oxidize the surface intentionally, the step of degreasing and activating the surface so as not to oxidize the surface intentionally in the same manner, and nickel strike plating up to an copper electroforming step; next, the resultant is subjected to copper electroforming, and is annealed preferably at 400° C., more preferably 500° C. or higher, thereby producing a composite piping material wherein the electroformed copper layer and niobium adhere strongly to each other. In this way, it is possible to decrease the use of electron beam welding so as to produce an acceleration cavity which can simultaneously attain a decrease in costs and a high accelerating electric field.

Industrial Applicability

The present invention makes it possible to produce a superconducting acceleration cavity, the demand of which will be increasing hereafter, economically, and further produce an electroformed copper/niobium composite piping material, which is the most important basic material for attaining high performances, by a combination of widely-usable electroforming technique in a wet manner and annealing after the electroforming As a result, a ripple effect of decreasing construction costs for an accelerator, which will be becoming large-sized hereafter and gives a prospect of an increase in construction costs, is produced. The accelerator itself is expected to be used widely not only for scientific research but also in fields of medicine, agriculture, engineering and others.

The invention claimed is:

1. A process for producing an electroformed copper/niobium composite piping material, characterized by that any one or each of an outer peripheral surface and an inner peripheral surface of a niobium thin piping material is coated with a nickel thin film, a surface of the nickel thin film is coated with copper by electroforming, and subsequently the thin piping material is annealed at the temperature range of 500° C. or more in a non-oxidizing atmosphere to accelerate dehydrogenation.

2. The process according to claim 1, wherein the niobium thin piping material is a material formed and worked so as to set a number of seams along an axial direction of the piping material to 1 or less.

3. The process according to claim 1, wherein the niobium thin piping material, which constitutes the electroformed copper/niobium composite piping material, has a wall thickness of 0.2 to 1.5 mm, a diameter of 100 to 600 mm, and a length of 200 to 4,000 mm.

4. The process according to claim 1, characterized by that before the coating with the nickel thin film, cleaning of the niobium thin piping material is performed so as not to promote oxidization of the surface of the niobium thin piping material.

5. The process according to claim 1, wherein the coating with the nickel thin film is performed by electroplating.

6. The process according to claim 1, wherein an electroformed copper layer has a film thickness of the film coated of 0.2 mm or more.

7. The producing process according to claim 1, characterized by that after the annealing, the copper-electroformed outer peripheral surface is further subjected to mechanical work to adjust shape precision thereof, and thereby the piping material is subjected to hydraulic bulge forming for cavity-formation.

8. The process according to claim 1, wherein the film thickness of the nickel thin film ranges from 0.05 to 5 μm.

9. The process according to claim 1, wherein the electroformed copper/niobium composite piping material is a material to be supplied for forming a superconducting acceleration cavity.

10. A process for producing a superconducting acceleration cavity, characterized by that the electroformed copper/niobium composite piping material obtained by the process according to claim 1 is subjected to hydraulic bulge forming.

11. A process for bonding an electroformed copper layer and a niobium thin piping material, characterized by that a composite piping material, in which any one or each of an outer peripheral surface and an inner peripheral surface of the niobium thin piping material is coated with a nickel thin film and further the electroformed copper layer is formed on a surface of the nickel thin film, is annealed at the temperature range of 500° C. or more in a non-oxidizing atmosphere to accelerate dehydrogenation thereby bonding the electroformed copper layer and the niobium thin piping material.

* * * * *